(12) United States Patent
Masuda (10) Patent No.: US 10,110,193 B2
(45) Date of Patent: Oct. 23, 2018

(54) LOW PASS FILTER

(71) Applicant: Murata Manufacturing Co., Ltd., Nagaokakyo-shi, Kyoto-fu (JP)

(72) Inventor: Hiroshi Masuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/443,101

(22) Filed: Feb. 27, 2017

(65) Prior Publication Data

US 2017/0170798 A1 Jun. 15, 2017

Related U.S. Application Data

(63) Continuation of application No. PCT/JP2016/051105, filed on Jan. 15, 2016.

(30) Foreign Application Priority Data

Mar. 24, 2015 (JP) .................................. 2015-060665

(51) Int. Cl.
*H03H 7/01* (2006.01)
*H03H 7/09* (2006.01)
*H01F 17/00* (2006.01)
*H03H 1/00* (2006.01)

(52) U.S. Cl.
CPC ....... *H03H 7/0115* (2013.01); *H01F 17/0013* (2013.01); *H03H 7/09* (2013.01); *H03H 7/1708* (2013.01); *H03H 7/1766* (2013.01); *H01F 2017/004* (2013.01); *H01F 2017/0026* (2013.01); *H03H 7/1725* (2013.01); *H03H 7/1733* (2013.01); *H03H 2001/0085* (2013.01)

(58) Field of Classification Search
CPC ......... H03H 2001/0085; H03H 7/0115; H03H 7/1733; H03H 7/1725
USPC .................................................. 333/175, 185
See application file for complete search history.

(56) References Cited

U.S. PATENT DOCUMENTS

2009/0189714 A1   7/2009  Sakisaka et al.
2013/0009726 A1   1/2013  Sasaki

FOREIGN PATENT DOCUMENTS

| JP | 2002-204136 A | 7/2002 |
|----|---------------|--------|
| JP | 2008-035468 A | 2/2008 |
| JP | 2009-182377 A | 8/2009 |
| JP | 2010-062260 A | 3/2010 |

(Continued)

OTHER PUBLICATIONS

English translation of JP2002204136; "Laminated Low-Pass Filter".*

(Continued)

*Primary Examiner* — Rakesh Patel
(74) *Attorney, Agent, or Firm* — Keating & Bennett, LLP (57) ABSTRACT

A low pass filter includes a first via-hole conductor connected to a first end portion of a first inductor and a third end portion of a second inductor and extending to another side in a lamination direction with respect to a second end portion of the first inductor and a fourth end portion of the second inductor, and a first capacitor electrically connected in parallel with at least a portion of the first inductor and a portion of the second inductor and defined by a first capacitor conductor layer. The low pass filter allows the interval between attenuation poles to be easily adjusted.

20 Claims, 6 Drawing Sheets (56) References Cited

FOREIGN PATENT DOCUMENTS

JP  2013-021449 A  1/2013
TW  M260882 U  4/2005

OTHER PUBLICATIONS

Official Communication issued in International Patent Application No. PCT/JP2016/051105, dated Mar. 29, 2016.
Official Communication issued in European Patent Application No. 16768108.9 dated Jan. 19, 2018.

* cited by examiner

LOW PASS FILTER

CROSS REFERENCE TO RELATED APPLICATIONS

This application claims the benefit of priority to Japanese Patent Application No. 2015-060665 filed on Mar. 24, 2015 and is a Continuation Application of PCT Application No. PCT/JP2016/051105 filed on Jan. 15, 2016. The entire contents of each application are hereby incorporated herein by reference.

BACKGROUND OF THE INVENTION

1. Field of the Invention

The present invention relates to a low pass filter, and more particularly relates to a low pass filter including two LC parallel resonators.

2. Description of the Related Art

An existing low pass filter disclosed in Japanese Unexamined Patent Application Publication No. 2013-21449 is known. This known low pass filter includes first to third capacitors, a first inductor, and a second inductor. The first capacitor and the first inductor form a first LC parallel resonator, and the second capacitor and the second inductor form a second LC parallel resonator. The first LC parallel resonator and the second LC parallel resonator are connected in series with each other. In addition, the third capacitor is connected between ground and a portion between the first LC parallel resonator and the second parallel resonator.

Figure 6:
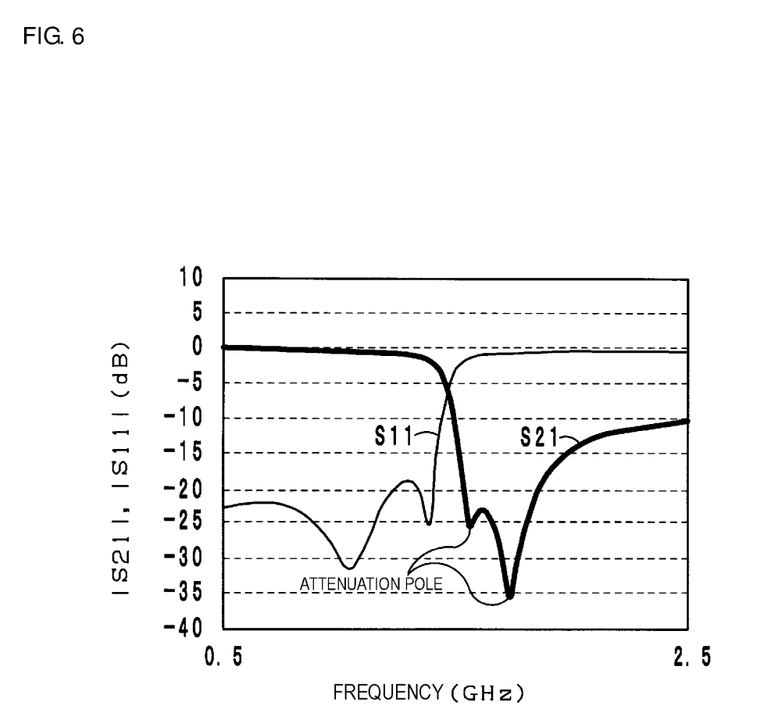
FIG. 6 is a graph showing the results of simulation of bandpass characteristics |S21| and reflection characteristics |S11| of a low pass filter according to a comparative example.

However, in the low pass filter disclosed in Japanese Unexamined Patent Application Publication No. 2013-21449, it is difficult to adjust the interval between two attenuation poles. FIG. 6 is a graph showing the results of simulation of bandpass characteristics |S21| and reflection characteristics |S11| of a low pass filter according to a comparative example having the same configuration as that of the low pass filter disclosed in Japanese Unexamined Patent Application Publication No. 2013-21449. In FIG. 6, the vertical axis indicates the bandpass characteristics and the reflection characteristics, and the horizontal axis indicates frequency.

In the low pass filter, as shown in FIG. 6, two attenuation poles are formed at frequencies higher than the pass band. In the low pass filter, there is a demand for obtaining desired bandpass characteristics by adjusting the interval between these attenuation poles. An example of a method for adjusting such an interval between attenuation poles is to change the structures of the first inductor and the second inductor to adjust the strength of magnetic coupling between the first inductor and the second inductor.

However, it is possible to improve the magnetic coupling between the first inductor conductor and the second inductor conductor by physically increasing the distance therebetween, but, when such a change is made, there is a possibility that the performance characteristics of the entire filter is deteriorated such that fine adjustments are not easily performed with such a method. In addition, as a result of changing the structures, due to deterioration of the Q value, desired attenuation characteristics cannot be obtained.

SUMMARY OF THE INVENTION

Preferred embodiments of the present invention provide a low pass filter that allows an interval between attenuation poles to be easily adjusted.

A low pass filter according to a preferred embodiment of the present invention includes a multilayer body including a plurality of insulator layers laminated in a lamination direction; a first LC parallel resonator including a first inductor including a first end portion at one side in the lamination direction and a second end portion at another side in the lamination direction, the first inductor having a helical shape turning around while extending in the lamination direction; a second LC parallel resonator including a second inductor including a third end portion at the one side in the lamination direction and a fourth end portion at the other side in the lamination direction, the second inductor having a helical shape turning around while extending in the lamination direction, the second LC parallel resonator being electrically connected in series with the first LC parallel resonator; a first via-hole conductor connected to the first end portion of the first inductor and the third end portion of the second inductor and extending to the other side in the lamination direction with respect to the second end portion of the first inductor and the fourth end portion of the second inductor; and a first capacitor electrically connected in parallel with at least a portion of the first inductor and a portion of the second inductor and defined by a first capacitor conductor layer.

According to preferred embodiments of the present invention, it is possible to easily adjust the interval between the attenuation poles.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5 is an exploded perspective view of the low pass filter 10a.

DETAILED DESCRIPTION OF THE PREFERRED EMBODIMENTS

Hereinafter, low pass filters according to preferred embodiments of the present invention will be described with reference to the drawings.

First Preferred Embodiment

Figure 1:
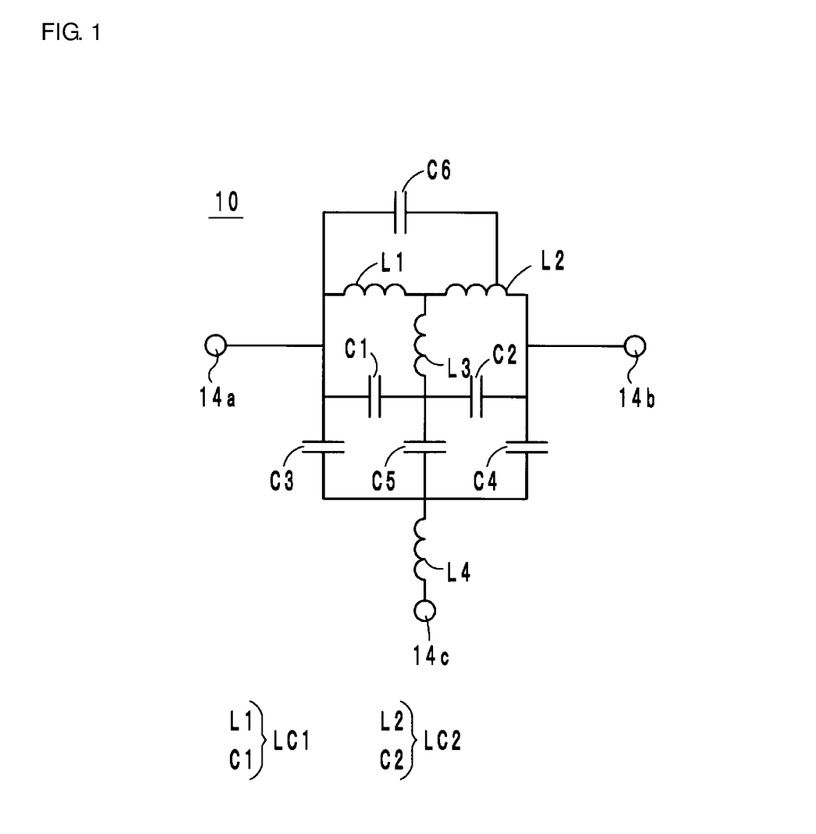
FIG. 1 is an equivalent circuit diagram of a low pass filter 10 according to a first preferred embodiment of the present invention.

Hereinafter, a low pass filter according to a first preferred embodiment of the present invention will be described with reference to the drawings. FIG. 1 is an equivalent circuit diagram of the low pass filter 10 according to the first preferred embodiment.

As shown in FIG. 1, the low pass filter 10 preferably includes LC parallel resonators LC1 and LC2, inductors L3 and L4, capacitors C3 to C6, and outer electrodes 14a to 14c. The outer electrodes 14a and 14b are input/output terminals, and the outer electrode 14c is a grounding terminal.

The LC parallel resonators LC1 and LC2 (an example of a first LC parallel resonator and a second LC parallel resonator) are electrically connected in series in this order between the outer electrode 14a and the outer electrode 14b. The LC parallel resonator LC1 includes an inductor L1 (an example of a first inductor) and a capacitor C1 (an example of a third capacitor). The inductor L1 and the capacitor C1 are electrically connected in parallel with each other. The LC parallel resonator LC2 includes an inductor L2 (an example of a second inductor) and a capacitor C2. The inductor L2 and the capacitor C2 are electrically connected in parallel with each other.

An end of the inductor L3 is connected to a portion between the inductor L1 and the inductor L2, and the other end of the inductor L3 is connected to a portion between the capacitor C1 and the capacitor C2.

An end of the inductor L4 is connected to the outer electrode 14c. One electrode of the capacitor C3 is connected to the outer electrode 14a, and the other electrode of the capacitor C3 is connected to the other end of the inductor L4. One electrode of the capacitor C4 is connected to the outer electrode 14b, and the other electrode of the capacitor C4 is connected to the other end of the inductor L4.

One electrode of the capacitor C5 (an example of a second capacitor) is connected to the portion between the capacitor C1 and the capacitor C2, and the other electrode of the capacitor C5 is connected to the other end of the inductor L4.

The capacitor C6 (an example of a first capacitor) is electrically connected in parallel with the inductor L1 and a portion of the inductor L2.

Figure 2:
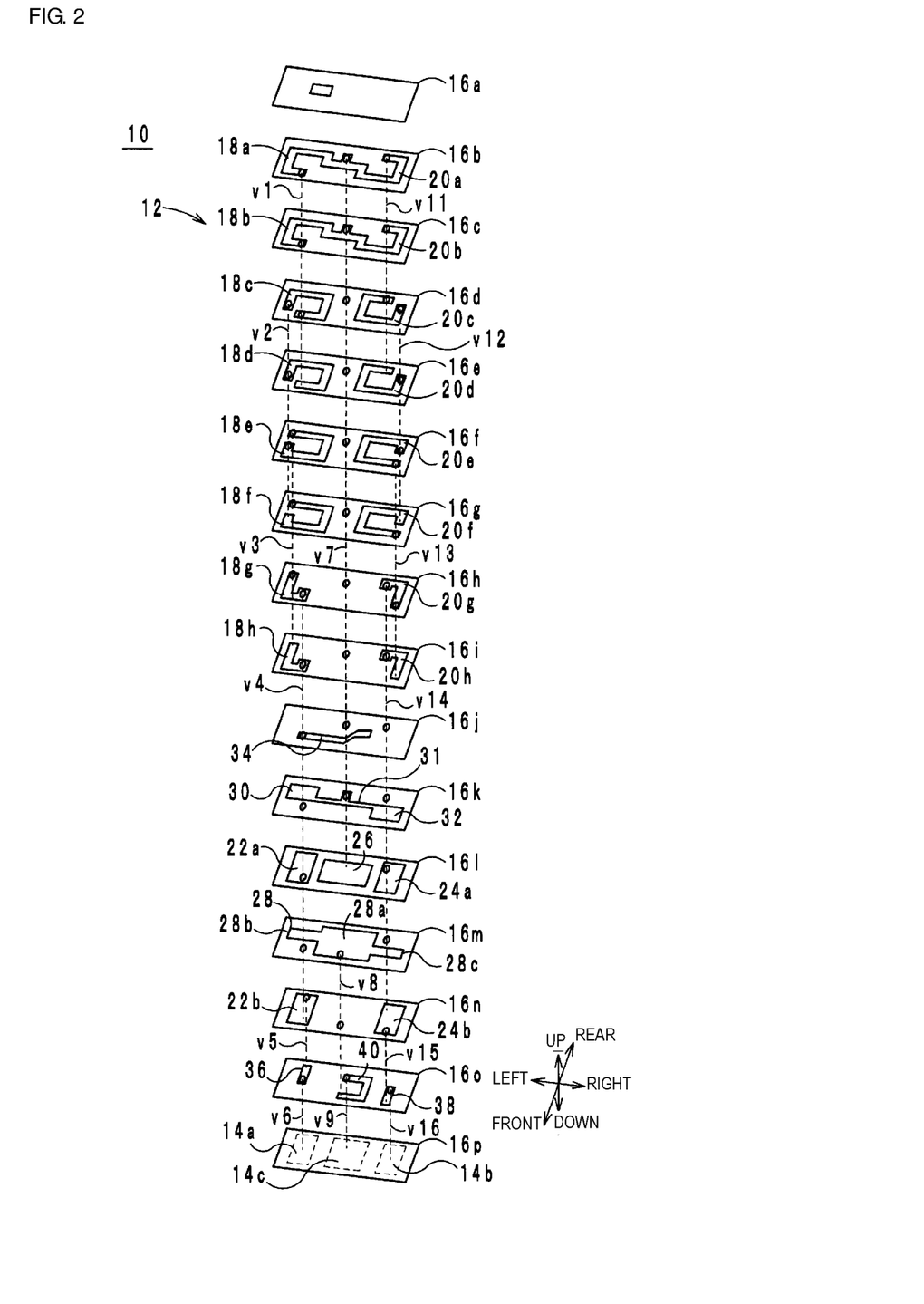
FIG. 2 is an exploded perspective view of the low pass filter 10.

Next, a specific configuration of the low pass filter 10 will be described with reference to the drawings. FIG. 2 is an exploded perspective view of the low pass filter 10. In the following, a lamination direction of the low pass filter 10 is defined as an up-down direction, a direction in which a long side of the low pass filter 10 extends when seen in plan view from above is defined as a right-left direction, and a direction in which a short side of the low pass filter 10 extends when seen in plan view from above is defined as a front-rear direction. The up-down direction, the right-left direction, and the front-rear direction are orthogonal to each other.

As shown in FIG. 2, the low pass filter 10 preferably includes a multilayer body 12, the outer electrodes 14a to 14c, inductor conductor layers 18a to 18h, 20a to 20h, and 40, capacitor conductor layers 22a, 22b, 24a, 24b, 26, 30, 32, and 34, a ground conductor layer 28 (28a to 28c), connection conductor layers 31, 36, and 38, and via-hole conductors v1 to v9 and v11 to v16.

As shown in FIG. 2, the multilayer body 12 preferably includes insulator layers 16a to 16p (an example of a plurality of insulator layers) laminated so as to be aligned from above to below, and preferably has a rectangular or substantially rectangular parallelepiped shape, for example. Each insulator layer 16 is a dielectric layer preferably having a rectangular or substantially rectangular shape, for example. Hereinafter, the upper principal surface of each insulator layer 16 is referred to as a front surface, and the lower principal surface of each insulator layer 16 is referred to as a back surface.

The outer electrodes 14a, 14c, and 14b each preferably have a rectangular or substantially rectangular shape, for example, and are provided on the lower surface of the multilayer body 12 so as to be aligned in this order from left to right. The outer electrodes 14a to 14c are provided only on the lower surface of the multilayer body 12, and are not provided on the front surface, the back surface, the left surface, and the right surface of the multilayer body 12. The outer electrodes 14a to 14c are preferably produced by plating a base electrode made of silver or copper, with Ni, Sn, or Au, for example.

The inductor conductor layers 18a to 18h are preferably provided on left half regions of the front surface of the insulator layers 16b to 16i, respectively, and are linear conductor layers each having a shape obtained by cutting a portion of a rectangular or substantially rectangular ring shape, for example. When seen in plan view from above, the inductor conductor layers 18a to 18h overlap each other to form a trajectory having a rectangular or substantially rectangular ring shape. In the following, end portions of the inductor conductor layers 18a to 18h at the upstream side in a clockwise direction are referred to as upstream ends, and end portions of the inductor conductor layers 18a to 18h at the downstream side in the clockwise direction are referred to as downstream ends.

The inductor conductor layer 18a and the inductor conductor layer 18b preferably have the same shape or substantially the same shape, and overlap each other in a state where the inductor conductor layers 18a and 18b coincide with each other when seen in plan view from above. The inductor conductor layer 18c and the inductor conductor layer 18d preferably have the same shape or substantially the same shape, and overlap each other in a state where the inductor conductor layers 18c and 18d coincide with each other when seen in plan view from above. The inductor conductor layer 18e and the inductor conductor layer 18f preferably have the same shape or substantially the same shape, and overlap each other in a state where the inductor conductor layers 18e and 18f coincide with each other when seen in plan view from above. The inductor conductor layer 18g and the inductor conductor layer 18h preferably have the same shape or substantially the same shape, and overlap each other in a state where the inductor conductor layers 18g and 18h coincide with each other when seen in plan view from above.

The via-hole conductor v1 penetrates the insulator layers 16b to 16d in the up-down direction and connects the upstream ends of the inductor conductor layers 18a and 18b to the downstream ends of the inductor conductor layers 18c and 18d. The via-hole conductor v2 penetrates the insulator layers 16d to 16f in the up-down direction and connects the upstream ends of the inductor conductor layers 18c and 18d to the downstream ends of the inductor conductor layers 18e and 18f. The via-hole conductor v3 penetrates the insulator layers 16f to 16h in the up-down direction and connects the upstream ends of the inductor conductor layers 18e and 18f to the downstream ends of the inductor conductor layers 18g and 18h. Accordingly, the inductor conductor layer 18a and the inductor conductor layer 18b are electrically connected in parallel with each other, the inductor conductor layer 18c and the inductor conductor layer 18d are electrically connected in parallel with each other, the inductor conductor layer 18e and the inductor conductor layer 18f are electrically connected in parallel with each other, and the inductor conductor layer 18g and the inductor conductor layer 18h are electrically connected in parallel with each other.

The inductor conductor layers 18a to 18g and the via-hole conductors v1 to v3 described above are included in the inductor L1. When seen in plan view from above, the inductor L1 preferably has a helical shape extending from the lower side to the upper side while turning around in the clockwise direction.

The capacitor conductor layers 22a and 22b are preferably rectangular or substantially rectangular conductor layers provided on left half regions of the front surfaces of the insulator layers 16l and 16n. The capacitor conductor layers 22a and 22b preferably have the same shape or substantially the same shape, and overlap each other in a state where the capacitor conductor layers 22a and 22b coincide with each other when seen in plan view from above.

The ground conductor layer 28 (an example of a first ground conductor layer) is provided on the front surface of the insulator layer 16m and is a cross-shaped conductor layer. The ground conductor layer 28 preferably includes a rectangular or substantially rectangular main body 28a provided at the center of the insulator layer 16m and band-shaped projection portions 28b and 28c projecting from the main body leftward and rightward, respectively. The capacitor conductor layer 22a and the projection portion 28b oppose each other with the insulator layer 16l interposed therebetween, and the capacitor conductor layer 22b and the projection portion 28b oppose each other with the insulator layer 16m interposed therebetween. The capacitor conductor layers 22a and 22b and the ground conductor layer 28 described above are included in the capacitor C3. The capacitor C3 is preferably provided below the inductors L1 and L2.

The connection conductor layer 36 is preferably provided on a left half region of the front surface of the insulator layer 16o and has a linear shape extending in the front-rear direction.

The via-hole conductor v5 penetrates the insulator layer 16n in the up-down direction and connects the capacitor conductor layer 22b to the rear end of the connection conductor layer 36. The via-hole conductor v6 penetrates the insulator layers 16o and 16p in the up-down direction and connects the front end of the connection conductor layer 36 to the outer electrode 14a. Accordingly, one electrode (the capacitor conductor layers 22a and 22b) of the capacitor C3 is connected to the outer electrode 14a.

The via-hole conductor v4 penetrates the insulator layers 16h to 16m in the up-down direction and connects the upstream ends of the inductor conductor layers 18g and 18h to the capacitor conductor layers 22a and 22b. Accordingly, the inductor L1 is connected to the outer electrode 14a.

The inductor conductor layer 40 is preferably provided near the center of the front surface of the insulator layer 16o and has a shape obtained by removing one side of a rectangle. An end portion of the inductor conductor layer 40 at the upstream side in a counterclockwise direction is referred to as an upstream end, and an end portion of the inductor conductor layer 40 at the downstream side in the counterclockwise direction is referred to as a downstream end. The inductor conductor layer 40 is included in the inductor L4.

The via-hole conductor v8 penetrates the insulator layers 16m and 16n in the up-down direction and connects the ground conductor layer 28 to the upstream end of the inductor conductor layer 40. Accordingly, the other electrode (the ground conductor layer 28) of the capacitor C3 is connected to the inductor L4.

The via-hole conductor v9 penetrates the insulator layers 16o and 16p in the up-down direction and connects the downstream end of the inductor conductor layer 40 to the outer electrode 14c. Accordingly, the inductor L4 is connected to the outer electrode 14c. Thus, the ground conductor layer 28 is electrically connected to the outer electrode 14c via the via-hole conductors v8 and v9 and the inductor conductor layer 40.

The capacitor conductor layer 26 (an example of a second capacitor conductor layer) is preferably a rectangular or substantially rectangular conductor layer provided at the center of the front surface of the insulator layer 16l. The main body 28a of the ground conductor layer 28 and the capacitor conductor layer 26 oppose each other with the insulator layer 16l interposed therebetween when seen in plan view from above. Accordingly, the capacitor conductor layer 26 and the ground conductor layer 28 are included in the capacitor C5. In addition, the capacitor C5 is preferably provided below the inductors L1 and L2.

The capacitor conductor layer 30 is a rectangular or substantially rectangular conductor layer provided on a left half region of the front surface of the insulator layer 16k. The capacitor conductor layer 22a and the capacitor conductor layer 30 oppose each other with the insulator layer 16k interposed therebetween when seen in plan view from above. Accordingly, the capacitor conductor layers 22a and 30 are included in the capacitor C1. The capacitor C1 is provided below the inductors L1 and L2.

The inductor conductor layers 20a to 20h, the capacitor conductor layers 24a, 24b, and 32, the connection conductor layer 38, and the via-hole conductors v11 to v16 preferably have point symmetry with the inductor conductor layers 18a to 18h, the capacitor conductor layers 22a, 22b, and 30, the connection conductor layer 36, and the via-hole conductors v1 to v6, respectively, about the centers of the insulator layers 16a to 16o (points of intersection between diagonal lines thereof). Therefore, the detailed description of the inductor conductor layers 20a to 20h, the capacitor conductor layers 24a, 24b, and 32, the connection conductor layer 38, and the via-hole conductors v11 to v16 is omitted. The downstream end of the inductor conductor layer 18a and the upstream end of the inductor conductor layer 20a are connected to each other, and the downstream end of the inductor conductor layer 18b and the upstream end of the inductor conductor layer 20b are connected to each other. That is, the upper end of the inductor L1 and the upper end of the inductor L2 are connected to each other. Accordingly, the inductor L1 and the inductor L2 are electrically connected in series with each other.

The inductor conductor layers 20a to 20g and the via-hole conductors v11 to v13 are included in the inductor L2. The capacitor conductor layers 24a and 24b and the ground conductor layer 28 are included in the capacitor C4. The capacitor conductor layers 24a and 32 are included in the capacitor C2.

The via-hole conductor v7 (an example of a first via-hole conductor) penetrates the insulator layers 16b to 16k in the up-down direction and connects the downstream ends of the inductor conductor layers 18a and 18b (i.e., an example of the upper end and a first end portion of the inductor L1) and the upstream ends of the inductor conductor layers 20a and 20b (i.e., the upper end and a third end portion of the inductor L2) to the capacitor conductor layer 26. Therefore, the via-hole conductor v7 extends to a position below the lower end of the inductor L1 (an example of a second end portion) and the lower end of the inductor L2 (an example of a fourth end portion). The via-hole conductor v7 is included in the inductor L3. Accordingly, one end of the inductor L3 is electrically connected to the portion between the inductor L1 and the inductor L2.

The connection conductor layer 31 is provided on the front surface of the insulator layer 16k and is a linear conductor layer extending in the right-left direction. The connection conductor layer 31 connects the capacitor conductor layer 30 to the capacitor conductor layer 32. Accordingly, the capacitor C1 and the capacitor C2 are electrically connected in series with each other.

In addition, the connection conductor layer 31 is connected to the via-hole conductor v7. Accordingly, the other end of the inductor L3 is connected to the portion between the capacitor C1 and the capacitor C2. Furthermore, the capacitor C1 is electrically connected in parallel with the inductor L1, and the capacitor C2 is electrically connected in parallel with the inductor L2.

The capacitor conductor layer 34 (an example of a first capacitor conductor layer) is provided on the front surface of the insulator layer 16j and is a linear conductor layer extending in the right-left direction. The left end of the capacitor conductor layer 34 is connected to the via-hole conductor v4. That is, the left end of the capacitor conductor layer 34 is connected to a portion between the inductor L1 and the capacitor C1. The right end of the capacitor conductor layer 34 overlaps the inductor L2 (i.e., the inductor conductor layers 20e and 20f) when seen in plan view from above. The capacitor conductor layer 34 is included in the capacitor C6. Accordingly, the capacitor C6 is electrically connected in parallel with the inductor L1 and a portion of the inductor L2. That is, the capacitor C6 is defined by the capacitor conductor layer 34.

The inductor conductor layers 18a to 18h, 20a to 20h, and 40, the capacitor conductor layers 22a, 22b, 24a, 24b, 26, 30, 32, and 34, the ground conductor layer 28, the connection conductor layers 31, 36, and 38, and the via-hole conductors v1 to v9 and v11 to v16 are preferably produced from an electrically conductive material, such as Cu for example.

Figure 3:
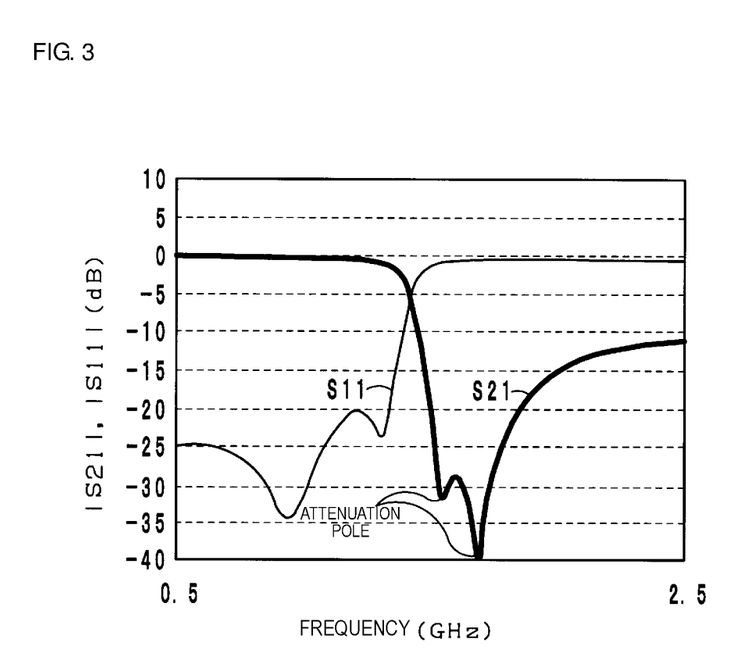
FIG. 3 is a graph showing the results of simulation of bandpass characteristics |S21| and reflection characteristics |S11| of the low pass filter 10.

With the low pass filter 10 according to the present preferred embodiment, it is possible to easily adjust the interval between attenuation poles. FIG. 3 is a graph showing the results of simulation of bandpass characteristics |S21| and reflection characteristics |S11| of the low pass filter 10. The vertical axis indicates the bandpass characteristics and the reflection characteristics, and the horizontal axis indicates frequency. FIG. 6 is a graph showing the results of simulation of bandpass characteristics |S21| and reflection characteristics |S11| of a low pass filter according to a comparative example of a preferred embodiment of the present invention. The low pass filter according to the comparative example of a preferred embodiment of the present invention is different from the low pass filter 10 in that the capacitor conductor layer 34 is not provided. Regarding the reference sign for each component of the low pass filter according to the comparative example, the same reference sign as for each component of the low pass filter 10 is used, and the description thereof will be given.

In the low pass filter according to the comparative example of a preferred embodiment of the present invention, the via-hole conductor v7 is connected to the upper end of the inductor L1 and the upper end of the inductor L2 and extends to a position below the lower end of the inductor L1 and the lower end of the inductor L2. The via-hole conductor v7 is long in the up-down direction and thus has a high inductance value, and forms the inductor L3. Therefore, the inductor L3 causes the inductor L1 and the inductor L2 to be strongly magnetically coupled with each other. When the inductor L1 and the inductor L2 are strongly magnetically coupled with each other, the interval between two attenuation poles defined by the LC parallel resonator LC1 and the LC parallel resonator LC2 is decreased as shown in FIG. 6.

Thus, in the low pass filter 10, by the capacitor conductor layer 34 being provided, the capacitor C6 is electrically connected in parallel with the inductor L1 and a portion of the inductor L2. Accordingly, in the low pass filter 10, the degree of capacitive coupling between the inductor L1 and the inductor L2 is higher than that in the low pass filter according to the comparative example, and hence the degree of inductive coupling between the inductor L1 and the inductor L2 is relatively decreased. Therefore, in the low pass filter 10, the magnetic coupling between the inductor L1 and the inductor L2 is reduced as compared to the low pass filter according to the comparative example. As a result, as shown in FIGS. 3 and 6, in the low pass filter 10, the interval between the two attenuation poles defined by the LC parallel resonator LC1 and the LC parallel resonator LC2 is increased as compared to the low pass filter according to the comparative example. By adjusting a capacitance value of the capacitor C6, it is possible to adjust the interval between the two attenuation poles. Specifically, as the capacitance value of the capacitor C6 increases, the interval between the two attenuation poles increases. Thus, in the low pass filter 10, it is possible to adjust the interval between the two attenuation poles without changing the structures of the inductors L1 and L2. Due to the above, in the low pass filter 10, it is possible to easily adjust the interval between the attenuation poles.

Second Preferred Embodiment

Figure 4:
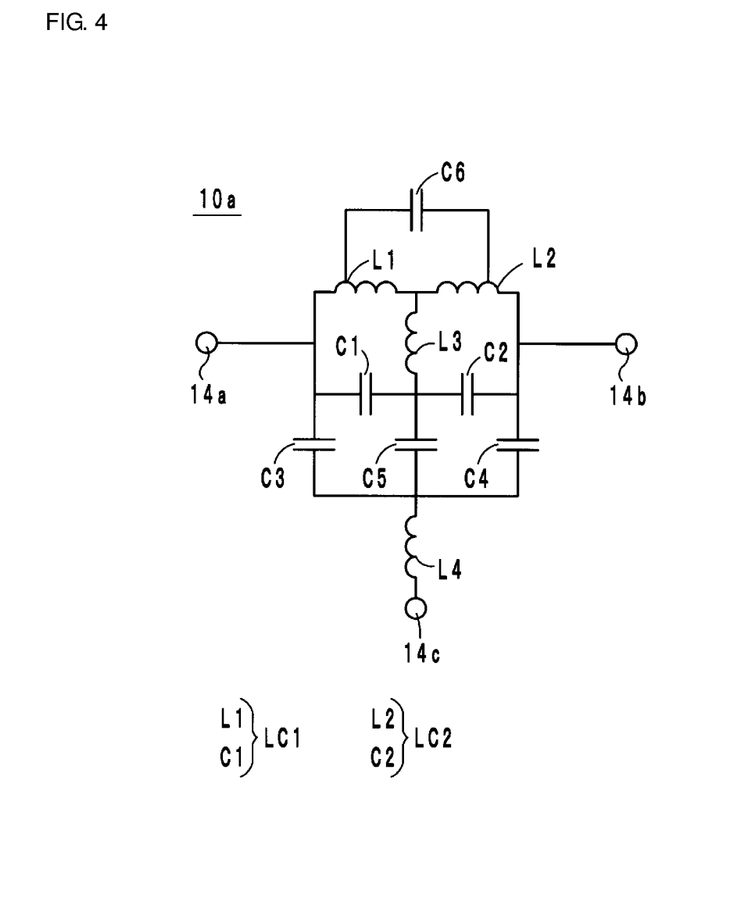
FIG. 4 is an equivalent circuit diagram of a low pass filter 10a according to a second preferred embodiment of the present invention.
Figure 5:
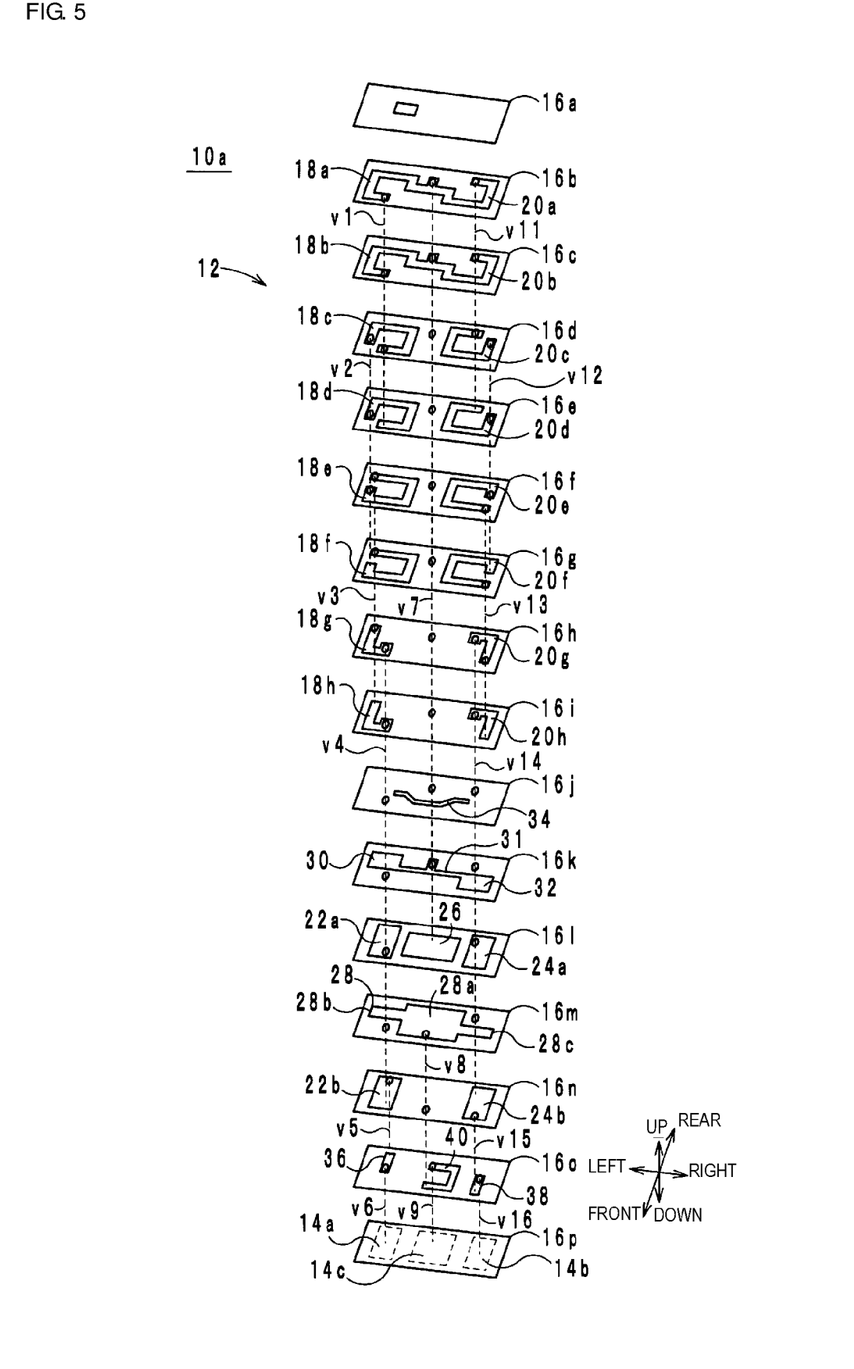

Hereinafter, the configuration of a low pass filter according to a second preferred embodiment of the present invention will be described with reference to the drawings. FIG. 4 is an equivalent circuit diagram of the low pass filter 10a according to the second preferred embodiment. FIG. 5 is an exploded perspective view of the low pass filter 10a.

The circuit configuration of the low pass filter 10a is different from the circuit configuration of the low pass filter 10 in a connection portion of the capacitor C6. More specifically, in the low pass filter 10a, the capacitor C6 is electrically connected in parallel with a portion of the inductor L1 and a portion of the inductor L2. The other circuit configuration of the low pass filter 10a is the same as the circuit configuration of the low pass filter 10, and thus the description thereof is omitted.

The specific configuration of the low pass filter 10a is different from the specific configuration of the low pass filter 10 in the structure of the capacitor conductor layer 34. More specifically, in the low pass filter 10a, the capacitor conductor layer 34 is not connected to the via-hole conductor v4 and is not connected to another conductor. Instead, the left end of the capacitor conductor layer 34 overlaps the inductor L1 (i.e., the inductor conductor layers 18e and 18f) when seen in plan view from above. The right end of the capacitor conductor layer 34 overlaps the inductor L2 (i.e., the inductor conductor layers 20e and 20f) when seen in plan view from above. The capacitor conductor layer 34 is included in the capacitor C6. Accordingly, the capacitor C6 is electrically connected in parallel with the portion of the inductor L1 and the portion of the inductor L2.

With the low pass filter 10a, similarly to the low pass filter 10, it is possible to easily adjust the interval between attenuation poles.

In addition, in the low pass filter 10a, the capacitor C6 includes a capacitor defined between the inductor L1 and the capacitor conductor layer 34 and a capacitor defined between the capacitor conductor layer 34 and the inductor L2, these capacitors being electrically connected in series.

Therefore, the capacitance value of the capacitor C6 of the low pass filter 10a is half the capacitance value of the capacitor C6 of the low pass filter 10. As described above, it is possible to adjust the capacitance value of the capacitor C6 on the basis of the manner in which the capacitor conductor layer 34 is connected. Thus, it is possible to adjust the interval between the attenuation poles.

Other Preferred Embodiments

The low pass filters according to preferred embodiments of the present invention are not limited to the low pass filter 10 or 10a, and can be modified in a variety of ways within the scope of the present invention.

The configuration of the low pass filter 10 and the configuration of the low pass filter 10a may be arbitrarily combined in any desirable way.

The capacitor C6 may be electrically connected in parallel with a portion of the inductor L1 (an example of the second inductor) and the inductor L2 (an example of the first inductor).

In the low pass filter 10, the capacitor conductor layer 34 may be connected directly to the inductor L1 (i.e., the inductor conductor layers 18a to 18h and the via-hole conductors v1 to v3).

The low pass filter 10 or 10a may further include an LC parallel resonator in addition to the LC parallel resonators LC1 and LC2.

As described above, preferred embodiments of the present invention are useful for a low pass filter, and are particularly excellent in that it is possible to easily adjust the interval between attenuation poles.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A low pass filter comprising:
a multilayer body including a plurality of insulator layers laminated in a lamination direction;
a first LC parallel resonator including a first inductor including a first end portion at a first side in the lamination direction and a second end portion at a second side in the lamination direction, the first inductor having a helical shape turning around while extending in the lamination direction;
a second LC parallel resonator including a second inductor including a third end portion at the first side in the lamination direction and a fourth end portion at the second side in the lamination direction, the second inductor including a helical shape turning around while extending in the lamination direction, the second LC parallel resonator being electrically connected in series with the first LC parallel resonator;
a first via-hole conductor connected to the first end portion of the first inductor and the third end portion of the second inductor and extending to the second side in the lamination direction with respect to the second end portion of the first inductor and the fourth end portion of the second inductor; and
a first capacitor electrically connected in parallel with at least a portion of the first inductor and a portion of the second inductor and defined by a first capacitor conductor layer; wherein
the first LC parallel resonator further includes a third capacitor electrically connected in parallel with the first inductor; and
the first capacitor conductor layer is electrically connected between the second end portion of the first inductor and the third capacitor, and overlaps the second inductor when seen in a plan view from the lamination direction.

2. The low pass filter according to claim 1, further comprising a second capacitor provided at the second side in the lamination direction with respect to the first inductor and the second inductor and including a second capacitor conductor layer and a first ground conductor layer opposing each other; wherein
the first via-hole conductor is connected to the second capacitor conductor layer.

3. The low pass filter according to claim 2, further comprising an outer electrode provided on a surface of the multilayer body at the second side in the lamination direction; wherein
the outer electrode and the first ground conductor layer are electrically connected to each other.

4. The low pass filter according to claim 1, further comprising a plurality of outer electrodes electrically connected to the first LC parallel resonator and the second LC parallel resonator.

5. The low pass filter according to claim 4, further comprising a fourth inductor electrically connected between the first ground conductor layer and one of the plurality of outer electrodes.

6. The low pass filter according to claim 4, wherein the first LC parallel resonator and the second LC parallel resonator are electrically connected in series between two of the plurality of outer electrodes, and a third one of the plurality of outer electrodes is connected to ground.

7. The low pass filter according to claim 1, further comprising a third inductor electrically connected between the first LC parallel resonator and the second LC parallel resonator.

8. A low pass filter comprising:
a multilayer body including a plurality of insulator layers laminated in a lamination direction;
a first LC parallel resonator including a first inductor including a first end portion at a first side in the lamination direction and a second end portion at a second side in the lamination direction, the first inductor having a helical shape turning around while extending in the lamination direction;
a second LC parallel resonator including a second inductor including a third end portion at the first side in the lamination direction and a fourth end portion at the second side in the lamination direction, the second inductor including a helical shape turning around while extending in the lamination direction, the second LC parallel resonator being electrically connected in series with the first LC parallel resonator;
a first via-hole conductor connected to the first end portion of the first inductor and the third end portion of the second inductor and extending to the second side in the lamination direction with respect to the second end portion of the first inductor and the fourth end portion of the second inductor; and
a first capacitor electrically connected in parallel with at least a portion of the first inductor and a portion of the second inductor and defined by a first capacitor conductor layer; wherein the first capacitor conductor layer is electrically connected only to the first inductor, and overlaps the second inductor when seen in a plan view from the lamination direction.

9. The low pass filter according to claim 8, further comprising a second capacitor provided at the second side in the lamination direction with respect to the first inductor and the second inductor and including a second capacitor conductor layer and a first ground conductor layer opposing each other; wherein
the first via-hole conductor is connected to the second capacitor conductor layer.

10. The low pass filter according to claim 9, further comprising an outer electrode provided on a surface of the multilayer body at the second side in the lamination direction; wherein
the outer electrode and the first ground conductor layer are electrically connected to each other.

11. The low pass filter according to claim 8, further comprising a third inductor electrically connected between the first LC parallel resonator and the second LC parallel resonator.

12. The low pass filter according to claim 8, further comprising a plurality of outer electrodes electrically connected to the first LC parallel resonator and the second LC parallel resonator.

13. The low pass filter according to claim 12, further comprising a fourth inductor electrically connected between the first ground conductor layer and one of the plurality of outer electrodes.

14. A low pass filter comprising:
a multilayer body including a plurality of insulator layers laminated in a lamination direction;
a first LC parallel resonator including a first inductor including a first end portion at a first side in the lamination direction and a second end portion at a second side in the lamination direction, the first inductor having a helical shape turning around while extending in the lamination direction;
a second LC parallel resonator including a second inductor including a third end portion at the first side in the lamination direction and a fourth end portion at the second side in the lamination direction, the second inductor including a helical shape turning around while extending in the lamination direction, the second LC parallel resonator being electrically connected in series with the first LC parallel resonator;
a first via-hole conductor connected to the first end portion of the first inductor and the third end portion of the second inductor and extending to the second side in the lamination direction with respect to the second end portion of the first inductor and the fourth end portion of the second inductor; and
a first capacitor electrically connected in parallel with at least a portion of the first inductor and a portion of the second inductor and defined by a first capacitor conductor layer; wherein
the first capacitor conductor layer overlaps the first inductor and the second inductor when seen in a plan view from the lamination direction.

15. The low pass filter according to claim 14, further comprising a second capacitor provided at the second side in the lamination direction with respect to the first inductor and the second inductor and including a second capacitor conductor layer and a first ground conductor layer opposing each other; wherein
the first via-hole conductor is connected to the second capacitor conductor layer.

16. The low pass filter according to claim 15, further comprising an outer electrode provided on a surface of the multilayer body at the second side in the lamination direction; wherein
the outer electrode and the first ground conductor layer are electrically connected to each other.

17. The low pass filter according to claim 14, further comprising a third inductor electrically connected between the first LC parallel resonator and the second LC parallel resonator.

18. The low pass filter according to claim 14, further comprising a plurality of outer electrodes electrically connected to the first LC parallel resonator and the second LC parallel resonator.

19. The low pass filter according to claim 18, further comprising a fourth inductor electrically connected between the first ground conductor layer and one of the plurality of outer electrodes.

20. The low pass filter according to claim 18, wherein the first LC parallel resonator and the second LC parallel resonator are electrically connected in series between two of the plurality of outer electrodes, and a third one of the plurality of outer electrodes is connected to ground.

* * * * *